(12) United States Patent
Asano et al.

(10) Patent No.: US 7,432,885 B2
(45) Date of Patent: Oct. 7, 2008

(54) ACTIVE MATRIX DISPLAY

(75) Inventors: Mitsuru Asano, Kanagawa (JP); Jiro Yamada, Kanagawa (JP); Takao Mori, Kanagawa (JP); Takashi Hirano, Kanagawa (JP)

(73) Assignee: Sony Corporation, Tokyo (JP)

( * ) Notice: Subject to any disclaimer, the term of this patent is extended or adjusted under 35 U.S.C. 154(b) by 245 days.

(21) Appl. No.: 10/051,359

(22) Filed: Jan. 18, 2002

(65) Prior Publication Data

US 2002/0190924 A1  Dec. 19, 2002

(30) Foreign Application Priority Data

Jan. 19, 2001 (JP) ............................ P2001-010976

(51) Int. Cl.
*G09G 3/30* (2006.01)
*G09G 3/12* (2006.01)
*G09G 3/10* (2006.01)

(52) U.S. Cl. .................. 345/76; 345/36; 315/169.3

(58) Field of Classification Search ........... 345/87–104, 345/211, 36, 76–81; 349/44; 257/59; 359/259; 315/169.3

See application file for complete search history.

(56) References Cited

U.S. PATENT DOCUMENTS

| | | | | |
|---|---|---|---|---|
| 4,982,273 A * | 1/1991 | Brody | .................. | 348/383 |
| 5,414,547 A * | 5/1995 | Matsuo et al. | ................ | 349/44 |
| 5,572,045 A * | 11/1996 | Takahashi et al. | ............. | 257/59 |
| 6,351,327 B1 * | 2/2002 | Walsh | .................. | 359/259 |
| 6,404,414 B2 * | 6/2002 | Ishii | .................. | 345/90 |
| 6,456,267 B1 * | 9/2002 | Sato et al. | .................. | 345/92 |
| 6,518,962 B2 * | 2/2003 | Kimura et al. | ............. | 345/211 |
| 6,538,374 B2 * | 3/2003 | Hosokawa | ................ | 313/504 |
| 6,618,029 B1 * | 9/2003 | Ozawa | .................. | 345/82 |

* cited by examiner

*Primary Examiner*—Sumati Lefkowitz
*Assistant Examiner*—Srilakshmi K Kumar
(74) *Attorney, Agent, or Firm*—Sonnenschein Nath & Rosenthal LLP

(57) ABSTRACT

An active matrix display comprises a circuitry layer and a device layer having a planarizing layer therebetween on the glass substrate. The circuitry layer has pixel circuits defining pixel units and the device layer has organic EL devices defining the pixel units. The organic EL devices are electrically connected with respective pixel circuits by contacts. The contacts are each positioned at the exterior of the emitting area, or the luminescent layer including an organic layer, of each pixel unit in the device layer.

8 Claims, 7 Drawing Sheets

ACTIVE MATRIX DISPLAY

BACKGROUND OF THE INVENTION

1. Field of the Invention

The present invention relates to active matrix displays comprising active devices for controlling pixel units to control the display. In particular, the present invention relates to an active matrix organic electroluminescence (EL) display comprising organic EL devices serving as luminescent devices, or electro-optic devices, for the pixel units.

2. Description of the Related Art

Organic EL displays using organic EL devices as luminescent devices, each included in a pixel unit, have recently been thought of for flat-panel displays. Since the organic EL devices exhibit a luminance of hundreds to tens of thousands of $cd/m^2$, an organic EL display using the organic EL devices as luminescent devices promise a flat panel display in the next generation.

The organic EL display may be driven by a passive matrix system or an active matrix system. The passive matrix system reduces an emitting period of pixels as the scanning lines increase in number. In order to achieve an upsized fine display, therefore, requires each organic device to instantaneously emit light with a high luminance. On the other hand, the active matrix allows the pixels to keep emitting over a frame, thus facilitating an upsized, fine display.

An organic EL device has a structure in which an organic layer including a luminescent layer lies between a transparent anode and a metal cathode. In an active matrix organic display, thin-film transistors (TFTs) are generally used as active devices for driving the organic EL devices. Pixel-driving circuits (hereinafter referred to as pixel circuits) including the TFTs are formed in a layer, and incorporated with organic EL devices, which are formed in another layer, corresponding thereto to form pixel units.

Specifically, the pixel circuits including the TFTs are prepared on a glass substrate to form a circuitry layer. A planarized layer is formed on the circuitry layer, and contacts for electrically connecting the pixel circuits with the organic EL devices are provided in the planarizing layer. Organic EL devices, in which the organic layer including the luminescent layer lies between two electrodes, are formed on the planarized layer to form a device layer. The organic layer generally has a very small thickness of a few micrometers or less, for example, a thickness of tens to hundreds of nanometers, and therefore the flatness of the lower electrode, on which the organic layer is formed, is extremely important.

The circuitry layer, in which pixel circuits including TFTs are arrayed according to pixels, is planarized by forming the planarizing layer. However, the formation of the contact causes an inevitable roughness or step of a few micrometers, thereby degrading the flatness of the lower electrode. As a result, shortcircuiting is exhibited between the upper and the lower electrodes. Also, thickness variation of the organic layer, which concentrates an electric field and deteriorate the device, can be exhibited in the surface direction.

SUMMARY OF THE INVENTION

Accordingly, it is an object of the present invention to provide an active matrix display including luminescent devices capable of being formed on a flat substrate and having an improved reliability.

To this end, according to one aspect of the present invention, there is provided an active matrix display. The active matrix display comprises a substrate and a device layer overlying the substrate and comprising luminescent devices defining pixel units arrayed in a matrix. A circuitry layer comprising pixel circuits for driving the respective luminescent devices and defining the pixel units is comprised on the substrate. The active matrix display also comprises contacts, each positioned at the exterior of the emitting area of each pixel unit in the device layer and electrically connecting the corresponding luminescent device with the corresponding pixel circuit.

According to another aspect of the present invention, an active matrix display is provided which comprises a substrate and a device and a circuitry layer overlying the substrate. The device layer comprises luminescent devices defining pixel units. Each luminescent device comprises a lower electrode, an upper electrode, and an organic layer including a luminescent layer and lying between the upper electrode and the lower electrode. The circuitry layer comprises pixel circuits for driving the respective luminescent devices. The pixel circuits defines the pixel units. Each lower electrode has a contact electrically connecting the corresponding luminescent device with the corresponding pixel circuit, and the upper electrode does not overlie the contact.

In the active matrix display, the formation of the contacts in the circuitry layer causes an inevitable roughness or step of a few micrometers thereon. Each contact is, therefore, positioned at the exterior of the emitting area of each pixel unit in the device layer. Thus, the roughness of the circuitry layer is minimized at the region thereof corresponding to the emitting layer and the flatness of the lower electrode of the luminescent device, which overlies the circuitry layer, is improved. Also, by providing the upper electrode so as not to overlie the lower electrode, shortcircuiting between the upper and the lower electrodes at the contacts is prevented. Thus, the luminescent devices are improved in the reliability.

DESCRIPTION OF THE PREFERRED EMBODIMENTS

Figure 1:
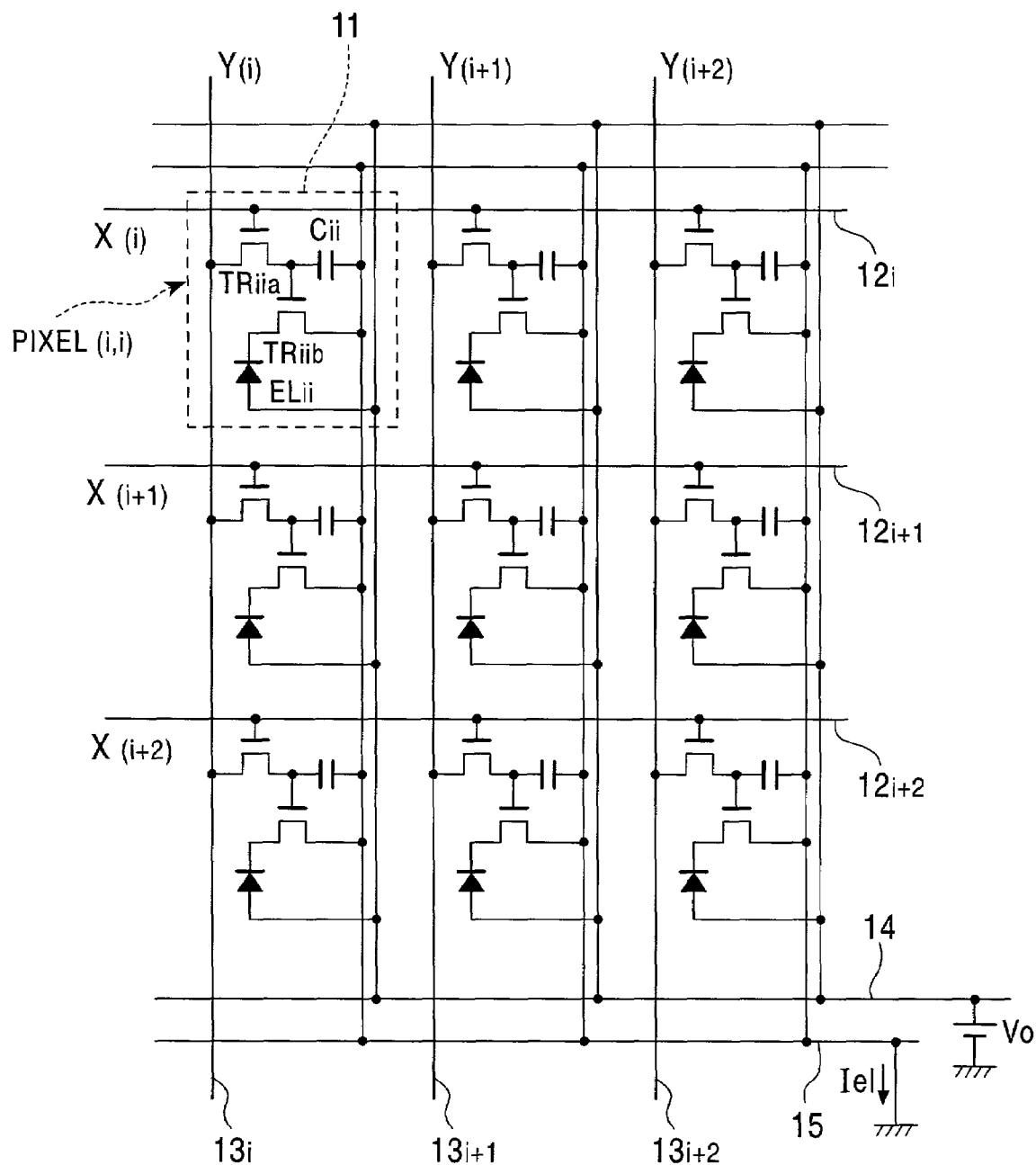
FIG. 1 is a circuit diagram showing a configuration of an active matrix organic EL display according to an embodiment of the present invention.

Embodiments of the present invention will now be described with reference to drawings. FIG. 1 is a circuit diagram showing a configuration of an active matrix display, for example an active matrix organic EL display, according to an embodiment of the present invention.

A display area of the active matrix display comprises many pixel circuits 11 arranged in a matrix, and FIG. 1 shows a fragmentary pixel arrangement with 3 rows and 3 columns including rows i to i+2 and columns i to i+2 to simplify the description. Corresponding to the rows i to i+2, the pixel circuits 11 have scan lines $12_i$ to $12_{i+2}$ for selecting pixels by row according to scanning signals X(i) to X(i+2) transmitted thereto. The pixel circuits 11 also have data lines $13_i$ to $13_{i+2}$ for delivering image data, such as luminance data Y(i) to Y(i+2), to pixels.

All the pixel circuits 11 have the same configurations, and will now be specifically described with reference to a pixel (i, i) as an example. In the embodiment, organic EL devices $EL_{ii}$ are used as display devices and TFTs are used as pixel transistors. The pixel circuit 11 is not limited to the configuration described in the embodiments.

The pixel circuit 11 has a selecting transistor $TR_{iia}$ for selecting a pixel, a hold capacitor $C_{ii}$ for holding a data voltage, and a driving transistor $TR_{iib}$ for driving an organic EL device $EL_{ii}$. A voltage according to luminance data is applied to the pixel circuit 11, and a current $I_{el}$ flows in the organic EL device $EL_{ii}$ according to the data voltage.

The anode of the organic EL device $EL_{ii}$ is connected to a common power line 14 with a line voltage of $V_0$. The driving transistor $TR_{iib}$ is connected between the cathode of the organic EL device $EL_{ii}$ and a common ground line 15. The hold capacitor $C_{ii}$ is connected between the gate of the driving transistor $TR_{iib}$ and the common ground line 15. The selecting transistor $TR_{iia}$ is connected between the data line $13_i$ and the gate of the driving transistor $TR_{iib}$. The gate of the selecting transistor $TR_{iia}$ is connected to the scan line $12_i$.

Figure 2:
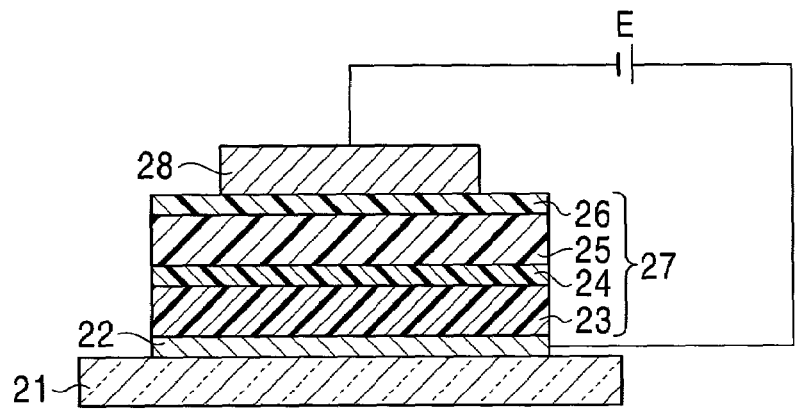
FIG. 2 is a sectional view showing a structure of an organic EL device.

Turning to FIG. 2, an example of a structure of the organic EL device will now be described. As shown in FIG. 2, the organic EL device comprises a substrate 21 formed with, for example, a transparent glass. An organic layer is formed on the substrate 21 by depositing a transparent conductive first electrode 22, which may be an anode, a hole transport layer 23, a luminescent layer 24, an electron transport layer 25, and an electron injection layer 26, in that order. A second electrode 28, which may be a cathode, is formed of a metal having a low work function on the organic layer 27.

In the organic EL device, a direct-current voltage E is applied between the first electrode 22 and the second electrode 28, so that holes are injected into the luminescent layer 24 from the first electrode 22 (anode) through the hole transport layer 23 and that electrons are injected into the luminescent layer 24 from the second electrode 28 (cathode) through the electron transport layer 25. The injected positive and negative carriers excite fluorescent molecules contained in the luminescent layer 24. Light is emitted when the excited state of the molecules is being relaxed.

Figure 3:
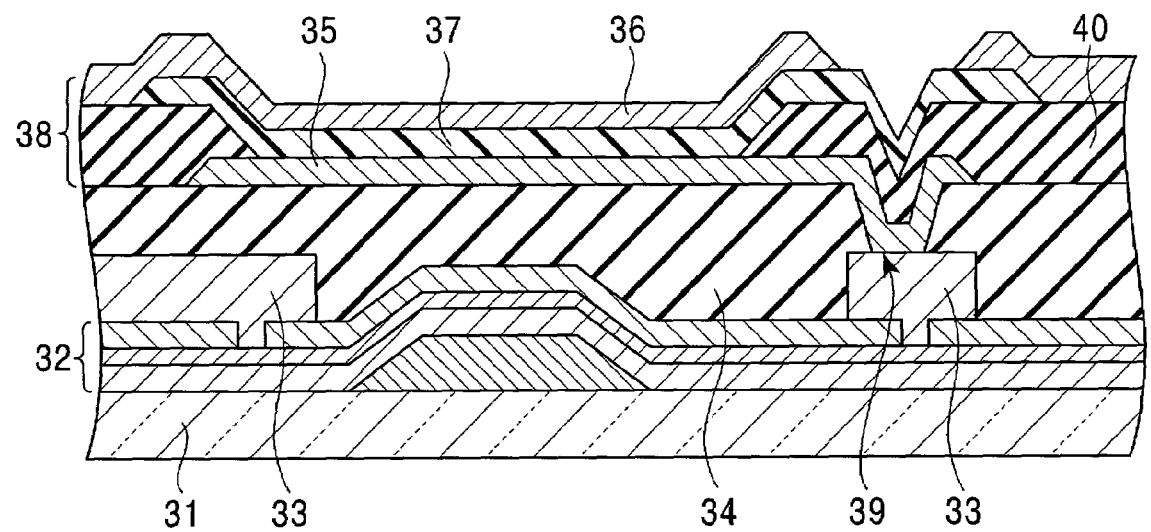
FIG. 3 is a sectional view showing a structure of an active matrix organic EL display according to an embodiment of the present invention.

FIG. 3 is a sectional view of an active matrix organic EL display according to an embodiment of the present invention, showing an organic EL device and a pixel circuit comprised in a pixel unit of the display.

In FIG. 3, the pixel circuit (TFT circuit) including the selecting transistor $TR_{iia}$ and the driving transistor $TR_{iib}$ is formed on a glass substrate 31 to form a circuitry layer 32. A patterned wiring 33, a planarizing layer 34, and an device layer 38 are formed on the circuitry layer 32, in that order. The device layer 38 includes organic EL devices, each having an organic layer 37 between a lower electrode 35 and an upper electrode 36, as described above. The lower and the upper electrodes 35 and 36 are separated by an insulating layer 40.

The lower electrode 35, the upper electrode 36, and the organic layer 37 correspond to the first electrode 22, the second electrode 28, and the organic layer 27 including the luminescent layer 24 shown in FIG. 2, respectively. The pixel circuit 11 in the circuitry layer 32 and the organic EL device in the device layer 38 are electrically connected at a contact 39 in the planarizing layer 34. As shown in FIG. 3, the lower electrode 35 is involved in the contact.

The contact 39 can cause a roughness or step of some micrometers in the surface of the circuitry layer 32, and the organic layer 37 of the organic EL device generally has a very small thickness of tens to hundreds of nanometers. The lower electrode 35, on which the organic layer 37 will be formed, therefore needs to be extremely flat. Accordingly, in the organic EL display according to the embodiment, the contact 39 is positioned out of the emitting area, or the organic layer 37 including the luminescent layer, of the organic EL device.

By positioning the contact 39 out of the emitting area of the organic EL device in the device layer 38, the roughness of the circuitry layer 32 is minimized at the region thereof corresponding to the emitting area, that is, the region thereof under the organic layer 37. As a result, the flatness of the lower electrode 35, which overlies the circuitry layer 32, is improved to increases the reliability of the organic EL device.

Combinations of the arrangement of organic EL devices and the arrangement of pixel circuits will now be described with reference to concrete embodiments.

First Embodiment

Figure 4:
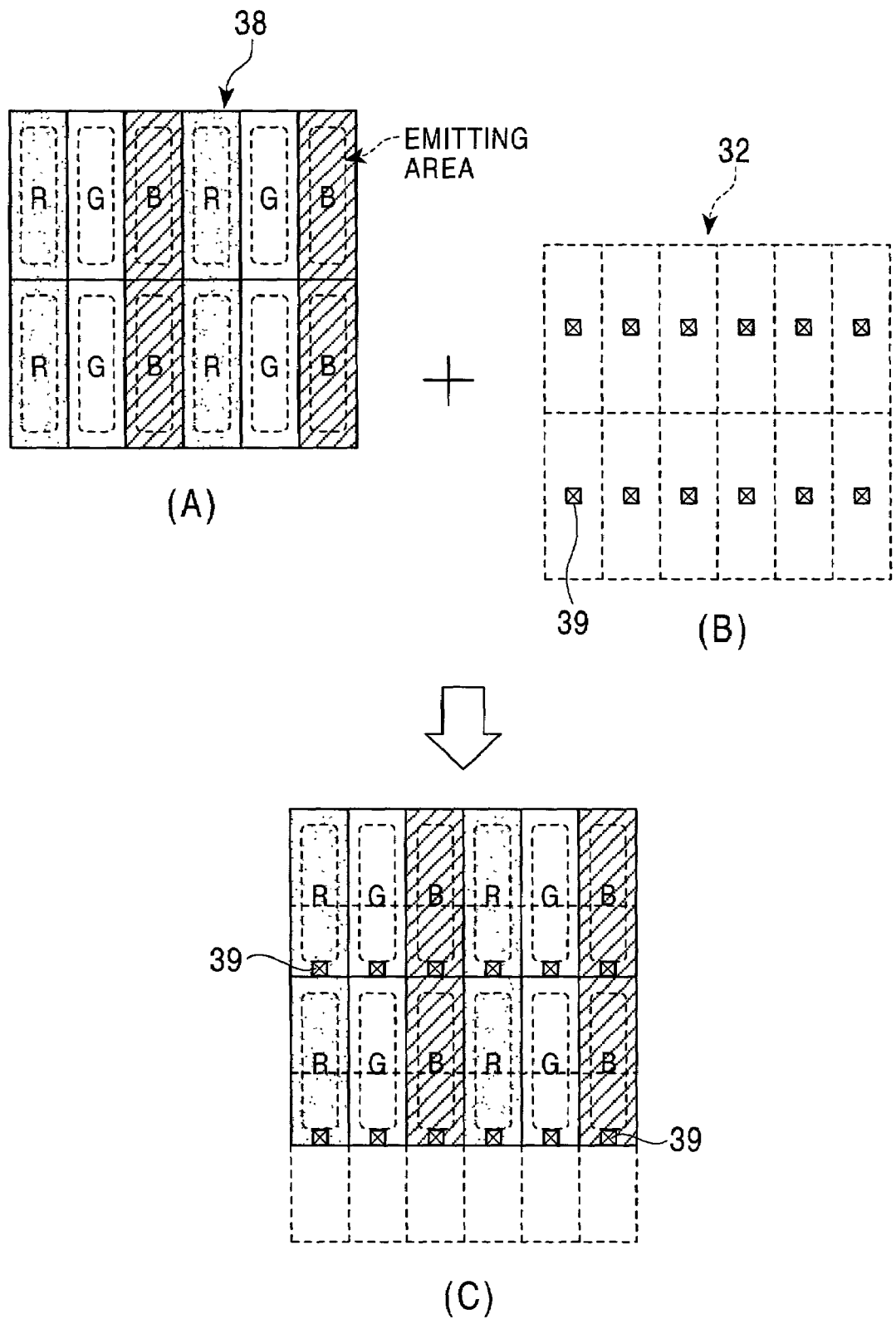
FIG. 4 is a plane pattern view showing a combination of the arrangements of organic EL devices and pixel circuits according to a first embodiment.

FIG. 4 is a plane view showing a combination of the arrangements of organic EL devices and pixel circuits according to a first embodiment. The organic EL devices for emitting RGB lights are arrayed in a stripe arrangement in the device layer 38, as shown in (a) of FIG. 4. The areas within broken lines shown in (a) of FIG. 4 are emitting areas for pixels. The pixel circuits are also arrayed in a stripe arrangement in the circuitry layer 32, as shown in (b) of FIG. 4

Since all the pixel circuits in the circuitry layer 32 have the same structure, the contacts 39, each connecting an organic EL device with a pixel circuit, are regularly arrayed. For example, here, the contacts 39 are arrayed in a single dimension in every row of the arrangement of the pixel circuits, positioned at the center of pixel circuits.

In this instance, if the device layer 38 is deposited on the circuitry layer 32 such that each organic EL device opposes a pixel circuit, the contacts 39 cannot be positioned out of the emitting areas of the pixel units, and the requirement for positioning the contacts 39 cannot be satisfied. Accordingly, the device layer 38 is deposited on the circuitry layer 32 so as to be offset with respect to the circuitry layer 32 by about half a pixel spacing in the row direction, in the first embodiment. Thus, the contacts 39 are positioned between the rows in the pixel arrangement, as shown in (c) of FIG. 4, to keep away from the emitting areas.

Although the device layer 38 is offset by about half a pixel spacing in the row direction in the first embodiment, it may be offset by about half a pixel spacing in the column direction. In this case, the contacts 39 are positioned between the columns in the pixel arrangement to keep away from the emitting areas.

Second Embodiment

Figure 5:
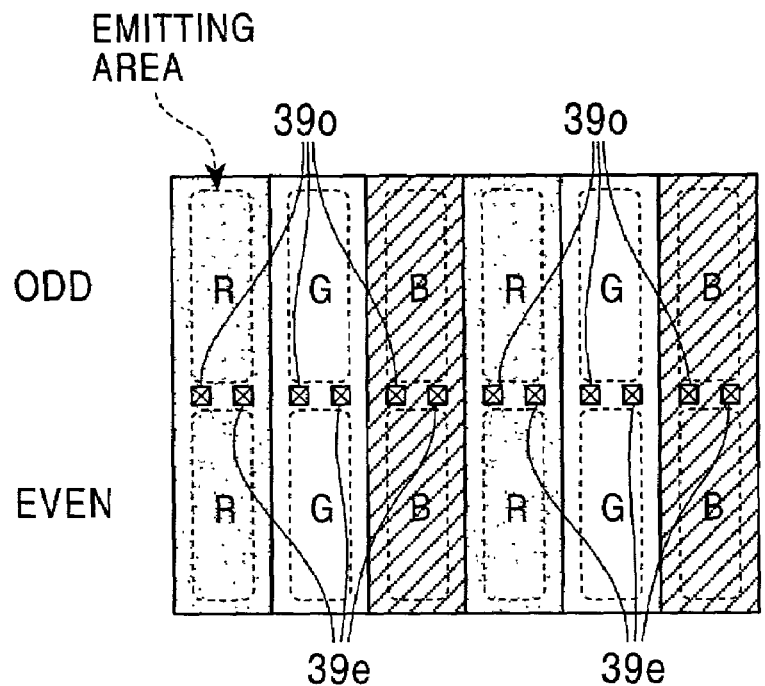
FIG. 5 is a plane pattern view showing a combination of the arrangements of organic EL devices and pixel circuits according to a second embodiment.

FIG. 5 is a plane view showing a combination of the arrangements of organic EL devices and pixel circuits according to a second embodiment. In the second embodiment, the organic EL devices and the pixel circuits are arrayed in a stripe arrangement in the device layer 38 and the circuitry layer 32, respectively, in the same manner as the first embodiment.

However, the device layer 38 overlies the circuitry layer 32 such that each organic EL device opposes a pixel circuit instead of being offset. The pixel circuits are, therefore, prepared in the circuitry layer 32 such that the contacts 39 will be positioned out of the emitting areas of the pixel units in the device layer 38.

Preferably, the contacts 39 for the pixel units in two adjacent rows in the pixel arrangement, that is, the contacts 39*o* for an odd row and the contacts 39*e* for an even row are arrayed in a single dimension between the two rows. Thus, the contacts 39 are positioned out of the emitting areas of the pixel units to minimize the decrease of the size of the emitting areas.

Although the contacts 39 for the pixel units in two adjacent rows in the pixel arrangement are positioned between the two rows in a single dimension in the second embodiment, the contacts 39 for the pixel units in two adjacent columns may be positioned between the two columns in a single dimension.

Third Embodiment

Figure 6:
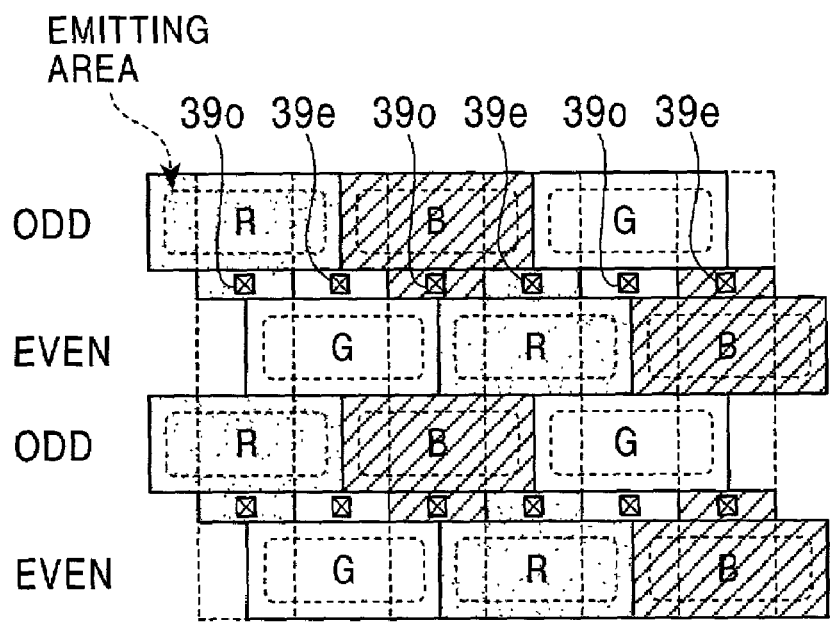
FIG. 6 is a plane pattern view showing a combination of the arrangements of organic EL devices and pixel circuits according to a third embodiment.

FIG. 6 is a plane view showing a combination of the arrangements of organic EL devices and pixel circuits according to a third embodiment. The third embodiment, while organic EL devices for emitting RGB lights are arrayed in a delta arrangement in the device layer 38, the pixel circuits are arrayed in a stripe arrangement in the circuitry layer 32.

In the third embodiment as well as in the second embodiment, the device layer 38 overlies the circuitry layer 32 such that each organic EL device opposes a pixel circuit, and the pixel circuits are prepared in the circuitry layer 32 such that the contacts 39 will be positioned out of the emitting areas of the pixel units in the device layer 38.

Preferably, the contacts 39 for the pixel units in two adjacent rows in the pixel arrangement, that is, the contacts 39*o* and 39*e* are arrayed in a single dimension between the two rows, as shown in FIG. 6. Thus, the contacts 39 are positioned out of the emitting areas to minimize the decrease of the size of the emitting areas, as described in the second embodiment.

In particular, the pixel arrangement according to the third embodiment has the combination of the delta arrangement of the organic EL devices and the stripe arrangement of the pixel circuits. As a result, even when the contacts 39 are each positioned at the center of the pixel circuit as described in the first embodiment, the contacts 39 can be positioned out of the emitting areas without forming the device layer 38 so as to be offset with respect to the circuitry layer 32.

Figure 7:
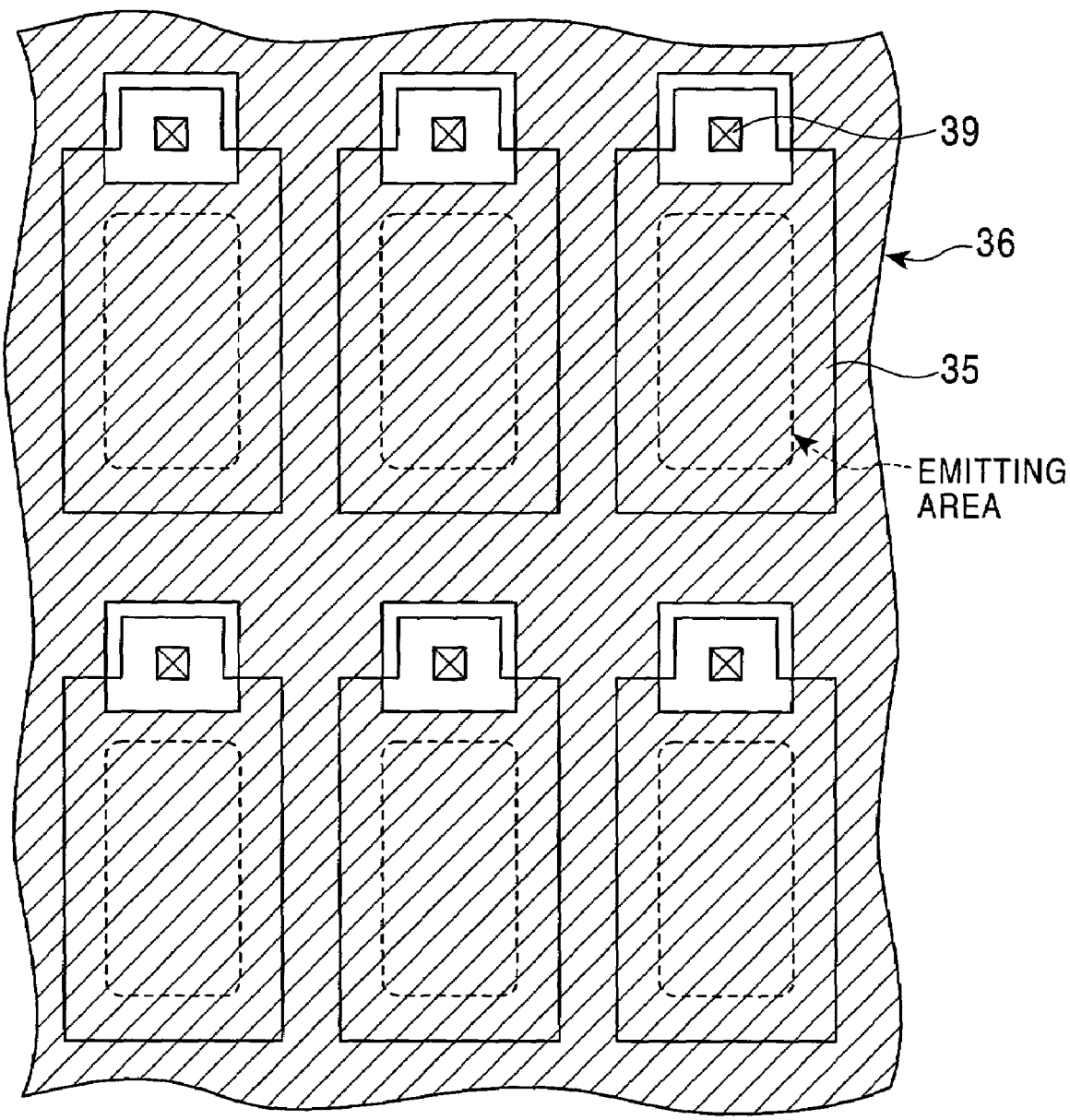
FIG. 7 is a plane view showing a layout of an upper electrode of organic EL devices according to an embodiment.

FIG. 7 is a plane view showing a layout of the upper electrode of the organic EL devices. In this embodiment, each emitting area and lower electrode 35 of the organic EL devices are formed for a pixel unit, and an upper electrode 36 covers the devices other than the contacts 39.

FIG. 3 shows that the lower electrode 35 has a large step at the contact 39. Although the insulating layer 40 is generally formed between the lower electrode 35 and the upper electrode 36, the large step is likely to cause shortcircuiting between the lower electrode 35 and the upper electrode 36. Accordingly, by forming the upper electrode 36 so as not to overlie the contact 39, the shortcircuiting between the lower electrode 35 and the upper electrode 36 is prevented to improve the reliability of the organic EL device.

Figure 8:
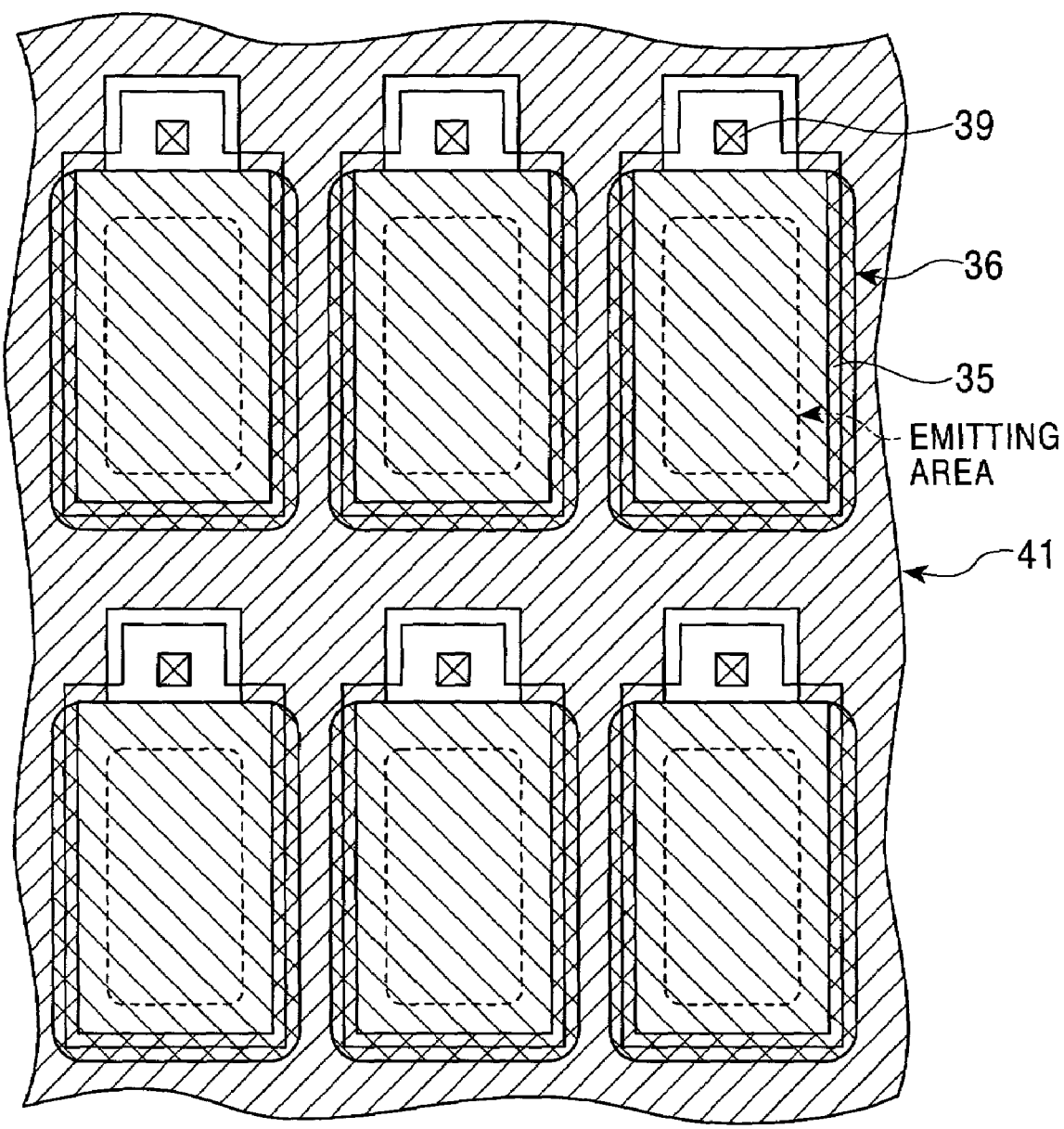
FIG. 8 is a plane view showing a layout of upper electrodes of organic EL devices according to an embodiment.
Figure 9:
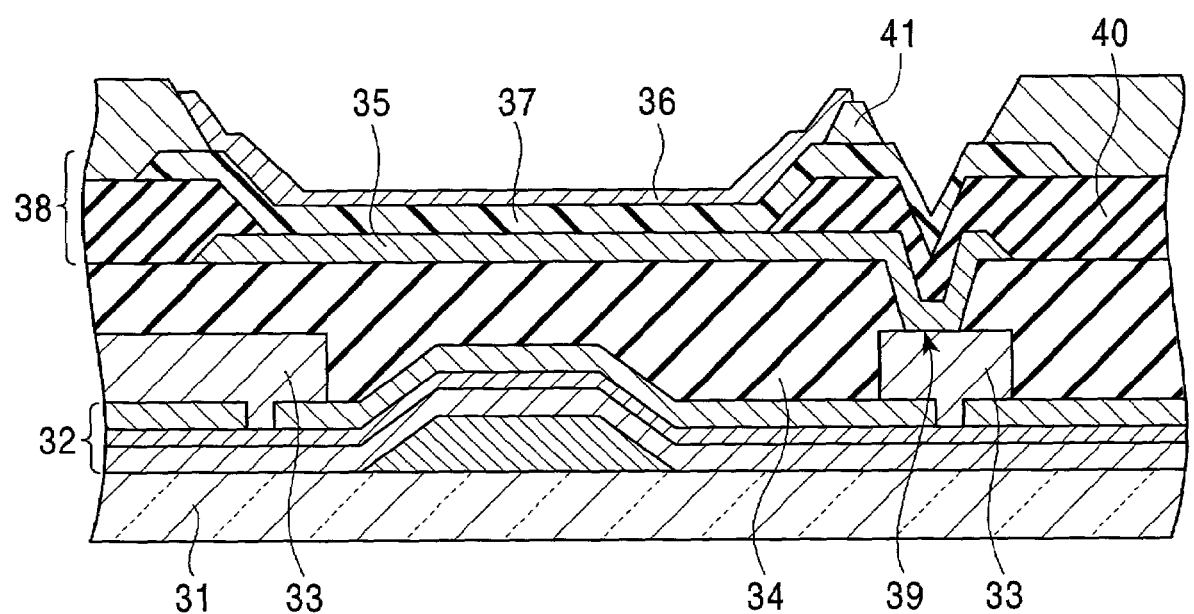
FIG. 9 is a sectional view showing an active matrix organic EL display having an auxiliary electrode, according to an embodiment.

FIG. 8 is a plane view showing a layout of a plurality of upper electrodes of the organic EL devices. In this embodiment, the upper electrodes 36 each oppose an emitting area and a lower electrode 35 of an organic EL device, and an auxiliary electrode 41 having a lower resistance than that of the upper electrodes 36 is formed around the upper electrodes 36, keeping away from the contacts 39. FIG. 9 is a sectional view showing a structure of an active matrix organic EL display according to this layout.

When a large organic EL device is manufactured, a voltage drop can be exhibited in the upper electrode 36. Using the auxiliary electrode 41 having a lower resistance than that of the upper electrodes 36 contributes to preventing the voltage drop.

However, even when the auxiliary electrode 41 is provided, shortcircuiting is likely to be exhibited at the contact between the lower electrode 35 and the upper electrode 36 or between the lower electrode 35 and the auxiliary electrode 41 due to a deteriorated flatness of the lower electrode. Accordingly, by forming the upper electrode 36 and auxiliary electrode 41 so as not to overlie the contact 39, the shortcircuiting between the lower electrode 35 and the upper electrode 36 or the auxiliary electrode 41 is prevented to improve the reliability of the organic EL device.

Although, in the embodiments of the present invention, the active matrix organic EL display including organic EL devices serving as luminescent devices is used, the embodiments of the present invention are not limited to the particular device and display described above and is applied to any active matrix displays having luminescent devices in which thin layers including a luminescent layer overlie a circuitry layer.

According to the present invention, by positioning the contacts at the exterior of the emitting area of the respective pixel units in the device layer or by providing the upper electrode so as not to overlie the lower electrode of each luminescent device, the flatness of the lower electrode, which is overlie the circuitry layer, is improved to increase the reliability of the luminescent device. Thus, a highly reliable active matrix display can be achieved.

What is claimed is:

1. An organic electroluminescence display having active-matrix circuitry, the organic electroluminescence display comprising:

a substrate;

a device layer provided on the substrate, the device layer comprising a plurality of luminescent devices defining pixel units arrayed in a matrix, each luminescent device having an emitting area that emits independently of the emitting areas of the other luminescent devices;

a circuitry layer provided between the substrate and the device layer, the circuitry layer comprising pixel circuits for driving the respective luminescent devices, the pixel circuits defining the pixel units; and contacts electrically connecting each of the luminescent devices with a corresponding pixel circuit, wherein the contacts are provided between adjacent emitting areas of the luminescent devices and between adjacent upper pixel electrodes that each cover a respective one of the emitting areas, wherein the contacts are arrayed in a single dimension for each row or column in the matrix, the contacts for the pixel units belonging to two adjacent rows or columns in the matrix are arrayed in a single dimension between the two adjacent rows or columns, and the contacts for two adjacent pixel units each belonging to a respective adjacent row or column are positioned directly between the two adjacent pixel units.

2. An organic electroluminescence display according to claim 1, wherein the luminescent devices are organic electroluminescence devices, each comprising a first electrode, a second electrode, and an organic layer including a luminescent layer and lying between the first electrode and the second electrode.

3. An organic electroluminescence display according to claim 1, wherein the pixel circuits each comprise a thin-film transistor.

4. An organic electroluminescence display having active-matrix circuitry, the organic electroluminescence display comprising:
   a substrate;
   a device layer provided on the substrate, the device layer comprising a plurality of luminescent devices defining pixel units, each luminescent device comprising a lower electrode, an upper electrode, and an organic light emitting layer provided between the upper electrode and the lower electrode, that emits independently of the emitting areas of the other luminescent devices; and
   a circuitry layer provided between the substrate and the device layer, the circuitry layer comprising pixel circuits for driving the respective luminescent devices, the pixel circuits defining the pixel units; wherein
      each lower electrode has a contact electrically connecting the corresponding luminescent device with the corresponding pixel circuit,
      the contact is provided between adjacent emitting areas of the luminescent devices and between adjacent upper pixel electrodes that each cover a respective one of the emitting areas,
      the contacts are arrayed in a single dimension for each row or column in the matrix,
      the contacts for the pixel units belonging to two adjacent rows or columns in the matrix are arrayed in a single dimension between the two adjacent rows or columns, and
      the contacts for two adjacent pixel units each belonging to a respective adjacent row or column are positioned directly between the two adjacent pixel units.

5. An organic electroluminescence display according to claim 4, wherein the pixel circuits each comprise a thin-film transistor.

6. An organic electroluminescence display having active-matrix circuitry, the organic electroluminescence display comprising:
   a substrate;
   a device layer provided on the substrate, the device layer comprising a plurality of luminescent devices defining RGB subpixel units, each luminescent device having an emitting layer comprised of different materials corresponding to the RGB subpixel units and having an emitting area that emits independently of the emitting areas of the other luminescent devices;
   a circuitry layer provided between the substrate and the device layer, the circuitry layer comprising pixel circuits for driving the respective luminescent devices, the pixel circuits defining the pixel units; and
   contacts electrically connecting each of the luminescent devices with a corresponding pixel circuit, wherein the contacts are provided between adjacent emitting areas of the luminescent devices and wherein at least one contact is provided for each of the luminescent devices, wherein
      the contacts are arrayed in a single dimension for each row or column in the matrix,
      the contacts for the pixel units belonging to two adjacent rows or columns in the matrix are arrayed in a single dimension between the two adjacent rows or columns, and
      the contacts for two adjacent pixel units each belonging to a respective adjacent row or column are positioned directly between the two adjacent pixel units.

7. An organic electroluminescence display having active-matrix circuitry, the organic electroluminescence display comprising:
   a substrate;
   a device layer provided on the substrate, the device layer comprising a plurality of luminescent devices defining pixel units arrayed in a matrix, each luminescent device having a lower electrode, an insulating layer provided on the lower electrode, the insulating layer having a plurality of windows defining emitting areas, an organic layer provided within the windows of the insulating layer, an upper electrode provided on the organic layer, and an auxiliary electrode provided on the insulating layer, the auxiliary electrode is connected to the upper electrode;
   a circuitry layer provided between the substrate and the device layer, the circuitry layer comprising pixel circuits for driving the respective luminescent devices, the pixel circuits defining the pixel units; and
   contacts electrically connecting each of the luminescent devices with a corresponding pixel circuit, wherein the contacts are provided under the insulating layer and wherein at least one contact is provided for each of the luminescent devices.

8. An organic electroluminescence display according to claim 7, wherein the upper electrode is provided except for the area which is directly above the contacts.

* * * * *